US006181633B1

United States Patent
Shimakawa et al.

(10) Patent No.: US 6,181,633 B1
(45) Date of Patent: Jan. 30, 2001

(54) SEMICONDUCTOR DEVICE

(75) Inventors: Kazuhiko Shimakawa; Yuji Yamasaki, both of Osaka (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/433,684

(22) Filed: Nov. 4, 1999

(30) Foreign Application Priority Data

Nov. 25, 1998 (JP) .................................................. 10-334640

(51) Int. Cl.[7] ................................ G11C 8/00; G11C 7/00
(52) U.S. Cl. ............................ 365/230.03; 365/230.06; 365/230.08; 365/189.05; 365/190
(58) Field of Search ........................ 365/230.03, 230.06, 365/230.08, 189.05, 190

(56) References Cited

U.S. PATENT DOCUMENTS

| 5,384,730 | * | 1/1995 | Vinal ..................................... 365/190 |
| 5,815,444 | * | 9/1998 | Ohta ................................. 365/189.05 |
| 5,852,570 | * | 12/1998 | Hotta et al. ............................. 365/51 |

FOREIGN PATENT DOCUMENTS 11-110963   4/1999   (JP) .

\* cited by examiner

*Primary Examiner*—Trong Phan
(74) *Attorney, Agent, or Firm*—Merchant & Gould P.C.

(57) ABSTRACT

A semiconductor device includes memory cells, each of which is a dynamic storage device, a memory cell array where the memory cells in a predetermined number are arranged in a matrix, the memory cells being connected to intersections of orthogonal word lines and bit lines; first sense amplifying circuits for amplifying electric potentials of the bit lines; main bit lines arranged in parallel to the bit lines; a memory block array formed such that a plurality of memory blocks including switching circuits share the main bit lines, the switching circuits controlling conductivity between outputs of the first sense amplifying circuits and the main bit lines; first selecting means for selecting the word lines and the first sense amplifying circuits belonging to at least one memory block of the plurality of memory blocks; second selecting means for selecting the switching circuits belonging to one memory block of the plurality of memory blocks; a control signal generating circuit for controlling the second selecting means. The semiconductor device includes a program circuit for programmably selecting either one of: acquiring addresses that specify positions of the memory cells as addresses for rows at a first timing; and acquiring addresses that specify positions of the memory cells as addresses for columns at a second timing that is different from the first timing.

8 Claims, 18 Drawing Sheets

(1) Address allocation in the case of page length=8/page

| Selected function block | Address |||||||||||||||| Timing for acquisition ||
|---|---|---|---|---|---|---|---|---|---|---|---|---|---|---|---|---|---|---|
| | A15 | A14 | A13 | A12 | A11 | A10 | A9 | A8 | A7 | A6 | A5 | A4 | A3 | A2 | A1 | A0 | RAS cycle | CAS cycle |
| Word line selection address | | | | | | | | O | O | O | O | O | O | O | O | O | O | |
| Block selection address | | | | | O | O | O | | | | | | | | | | O | |
| Main bit line selection address | | | | O | O | | | | | | | | | | | | O | |
| Output buffer selection address | O | O | O | | | | | | | | | | | | | | | O |

(2) Address allocation in the case of page length=32/page

| Selected function block | Address |||||||||||||||| Timing for acquisition ||
|---|---|---|---|---|---|---|---|---|---|---|---|---|---|---|---|---|---|---|
| | A15 | A14 | A13 | A12 | A11 | A10 | A9 | A8 | A7 | A6 | A5 | A4 | A3 | A2 | A1 | A0 | RAS cycle | CAS cycle |
| Word line selection address | | | | | | | | O | O | O | O | O | O | O | O | O | O | |
| Block selection address | | | | | O | O | O | | | | | | | | | | O | |
| Main bit line selection address | | | | O | O | | | | | | | | | | | | | O |
| Output buffer selection address | O | O | O | | | | | | | | | | | | | | | O |

(3) Address allocation in the case of page length=64/page

| Selected function block | Address |||||||||||||||| Timing for acquisition ||
|---|---|---|---|---|---|---|---|---|---|---|---|---|---|---|---|---|---|---|
| | A15 | A14 | A13 | A12 | A11 | A10 | A9 | A8 | A7 | A6 | A5 | A4 | A3 | A2 | A1 | A0 | RAS cycle | CAS cycle |
| Word line selection address | | | | | | | | O | O | O | O | O | O | O | O | O | O | |
| Block selection address | | | | | O | O | | | | | | | | | | | O | |
| Main bit line selection address | | | | O | O | O | | | | | | | | | | | | O |
| Output buffer selection address | O | O | O | | | | | | | | | | | | | | | O |

(4) Address allocation in the case of page length=128/page

| Selected function block | Address |||||||||||||||| Timing for acquisition ||
|---|---|---|---|---|---|---|---|---|---|---|---|---|---|---|---|---|---|---|
| | A15 | A14 | A13 | A12 | A11 | A10 | A9 | A8 | A7 | A6 | A5 | A4 | A3 | A2 | A1 | A0 | RAS cycle | CAS cycle |
| Word line selection address | | | | | | | | O | O | O | O | O | O | O | O | O | O | |
| Block selection address | | | | | O | | | | | | | | | | | | O | |
| Main bit line selection address | | | | O | O | O | O | | | | | | | | | | | O |
| Output buffer selection address | O | O | O | | | | | | | | | | | | | | | O |

FIG. 12

(1) Example of activated area in page length=8,32/page
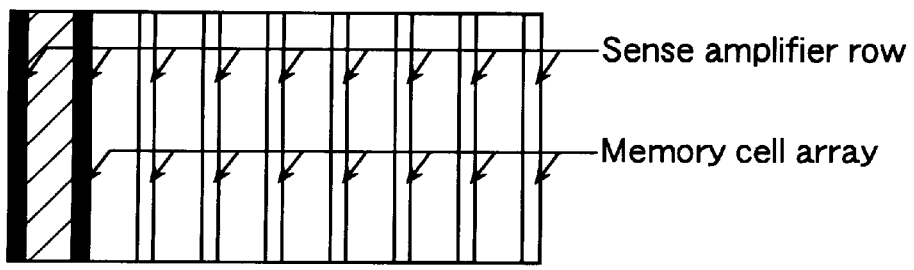
— Sense amplifier row
— Memory cell array
(2) Example of activated area in page length=64/page
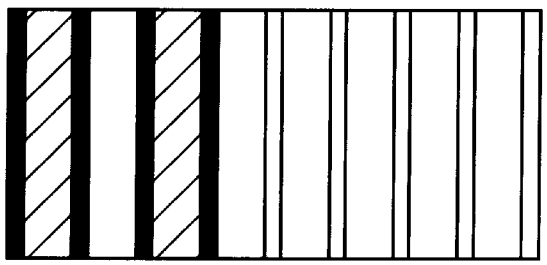
(3) Example of activated area in page length=128/page
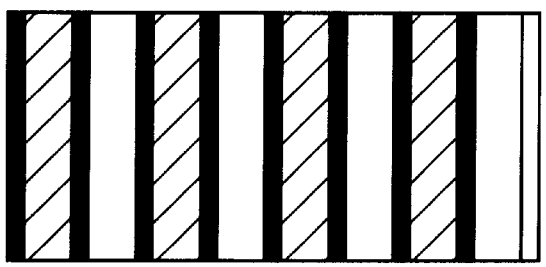
FIG. 13

SEMICONDUCTOR DEVICE

BACKGROUND OF THE INVENTION

1. Field of the Invention

The present invention relates to a semiconductor device using a dynamic RAM (hereinafter, referred to as "DRAM"). In particular, the present invention relates to a technique that is characterized by means for easily setting an optimal page length and data input/output width in accordance with a system to which the DRAM is applied and is effective for achieving low power consumption and high speed for the DRAM.

2. Description of the Prior Art

In recent years, DRAMs are utilized in the form of a macrocell so as to be mounted on one semiconductor substrate together with a microprocessor or an ASIC (application specific IC, hereinafter referred to as "logic").

When the DRAM is mounted on a semiconductor substrate together with a microprocessor or a logic, the constraints caused by the number of pins of the DRAM can be eliminated, unlike the case where the DRAM is attached externally. Therefore, the data width for data input and output can be extended, and the data transfer rate between the DRAM and the logic can increase significantly. In addition, the DRAM and the logic can be connected over a short distance by metal wiring, so that the parasitic capacitance of input/output wiring can decrease significantly. Thus, low power consumption can be achieved.

The basic operation of the DRAM includes the first operation period, the second operation period, and the third operation period. In the first operation (hereinafter, referred to as "RAS cycle"), the data of memory cells in a specified area is read by activating a sense amplifier and is stored. In the second operation (hereinafter, referred to as "CAS cycle"), the data stored in the sense amplifier is divided by a predetermined unit, and is output to the outside sequentially, or the data input from the outside is written in the sense amplifier. In the third operation (hereinafter, referred to as "precharge cycle"), a precharge state is set for a next operation cycle.

As an independent DRAM product for practical use, DRAMs of various specifications such as a fast page mode DRAM, an EDO DRAM, and a synchronous DRAM are used commonly. All of these DRAMs are configured based on the basic operations described above, and also a DRAM macrocell mounted with other components on a semiconductor substrate is configured based on any one of these specifications.

Furthermore, in the DRAM macrocell mounted with other components, the storage capacity or the data width for input and output is changed in accordance with the specification of the semiconductor device to which the DRAM macrocell is applied and the product use for each predetermined unit.

The semiconductor devices provided with the DRAMs are used in various fields, and the performance required for the DRAM is varied with the use. For example, in the case where the DRAM is used in a system that processes image data for graphics, a high speed clock of 100 MHz or more is required to increase the data transfer rate. For this reason, wide page length and high speed in the data transfer rate are required in a page mode or a mode comparable thereto.

Furthermore, in the case where the DRAM is used in a system of portable equipment or consumer products, the DRAM is used generally in a random access mode using a clock frequency of about several tens MHz or an access mode using a relatively short page length. Thus, low power consumption is required rather than the high speed data transfer rate.

The page operation of the DRAM is an operation to read (or write) the data in the sense amplifier activated in the first operation period for each predetermined unit sequentially in the second operation period. Therefore, the page length can be larger as the activated area is larger. On the other hand, the power consumption of the DRAM depends significantly on the area of the activated memory cells and the number of the activated sense amplifiers, so that the power consumption can be smaller as the activated area is smaller.

In the conventional semiconductor device using the DRAM, the area of the memory cells and the number of the sense amplifiers to be activated in the first operation period are fixed. Moreover, since the DRAM is supposed to be mounted in semiconductor devices for various uses, the page length is as relatively long as that of an independent DRAM product, in order to avoid constraints in the functions. Therefore, the DRAM has extra functions that are not required for portable equipment or consumer products, which place importance on low power consumption, and the low power consumption is not sufficiently achieved.

SUMMARY OF THE INVENTION

Therefore, with the foregoing in mind, it is an object of the present invention to provide a semiconductor device including means for easily setting an optimal page length in accordance with the application use of the DRAM macrocell so that the low power consumption can be achieved.

A semiconductor device of the present invention includes memory cells, each of which is a dynamic storage device; a memory cell array where the memory cells in a predetermined number are arranged in a matrix, the memory cells being connected to intersections of orthogonal word lines and bit lines; first sense amplifying circuits for amplifying electric potentials of the bit lines; main bit lines arranged in parallel to the bit lines; a memory block array formed such that a plurality of memory blocks including switching circuits share the main bit lines, the switching circuits controlling conductivity between outputs of the first sense amplifying circuits and the main bit lines; first selecting means for selecting the word lines and the first sense amplifying circuits belonging to at least one memory block of the plurality of memory blocks; second selecting means for selecting the switching circuits belonging to one memory block of the plurality of memory blocks; a control signal generating circuit for controlling the second selecting means. The semiconductor device includes a program circuit for selecting either one of acquiring addresses that specify positions of the memory cells as addresses for rows at a first timing and acquiring addresses that specify positions of the memory cells as addresses for columns at a second timing that is different from the first timing.

This embodiment allows the page length to be set arbitrarily and the activated area of the DRAM macrocell to be physically obtained continuously. Therefore, the data transfer rate can be increased. This effect is expected to be significant, especially in a memory interleaving system.

Furthermore, in the semiconductor device of the present invention, preferably, the program circuit selects either one of acquiring at least one address signal for controlling the second selecting means at the same timing as that of an address signal for controlling the first selecting means and acquiring at least one address signal for controlling the second selecting means at a timing that is later than the timing of an address signal for controlling the first selecting means. This embodiment allows the page length to be set arbitrarily and the activated area of the DRAM macrocell to be physically obtained continuously. Therefore, the data transfer rate can be increased. This effect is expected to be significant, especially in a memory interleaving system. It is sufficient to make this selection for at least one address signal, and it is not necessary for all the address signals.

Furthermore, in the semiconductor device of the present invention, preferably, the program circuit selects either one of (a) making ineffective at least one address signal for controlling the first selecting means and connecting the ineffective address signal as an address signal for controlling the second selecting means and (b) treating all address signals for controlling the first selecting means as effective and connecting all the address signals. This embodiment allows the page length to be set arbitrarily and only a minimum activated area to be read or written when the data width is not sufficient. Therefore, in addition to the advantage that the data transfer rate can be increased, the power can be saved.

Furthermore, preferably, the semiconductor device of the present invention further includes second sense amplifying circuits for amplifying data on the main bit lines and latch circuits for latching output data from the second sense amplifying circuits. The control signal generating circuit controls the second selecting means, the second sense amplifying circuits and the latch circuits. The semiconductor device includes a program circuit for selecting either one of generating a control signal of the switching circuit in the control signal generating circuit every time an instruction to read addresses for columns is issued and generating a control signal of the switching circuit in the control signal generating circuit only once when a first instruction to read addresses for columns is issued. This embodiment makes it possible to switch whether the amplification operation of the main amplifier for addresses for columns occurs every time or only at the first time. Therefore, when a wide page length is not necessary, wasteful read operation can be eliminated, so that the power can be saved.

Furthermore, in the semiconductor device of the present invention, preferably, the program circuit includes programmable connecting means. This embodiment ensures switching of the circuit.

According to another aspect of the present invention, a semiconductor device of the present invention includes a memory cell array where the memory cells in a predetermined number are arranged in a matrix, the memory cells being connected to intersections of orthogonal word lines and bit lines; first sense amplifying circuits for amplifying electric potentials of the bit lines; a memory block array formed such that a plurality of memory blocks including switching circuits share main bit lines, the switching circuits controlling conductivity between outputs of the first sense amplifying circuits and the main bit lines; second sense amplifying circuits for amplifying data on the main bit lines; latch circuits for latching output data from the second sense amplifying circuit; a plurality of tristate buffers that receive outputs from the latch circuits and whose outputs are connected to become common; first selecting means for selecting the word lines and the second sense amplifying circuits belonging to at least one memory block of the plurality of memory blocks; second selecting means for selecting the switching circuits belonging to one memory block of the plurality of memory blocks; and a control signal generating circuit for controlling the second sense amplifying circuit, the latch circuit, and the tristate buffers. Only one output of a plurality of outputs, each of which is output from the plurality of tristate buffers whose outputs are connected to become common, is set to be outputable.

This embodiment allows the power to be saved, because the second sense amplifier is not necessarily activated every time, and it is sufficient to acquire outputs from the tristate buffers. Moreover, in the case where outputs from a plurality of tristate buffers are connected by a metal, the data width can be changed easily without changing the circuit configuration or the layout.

Thus, the semiconductor device of the present invention makes it possible to set the activated area and the page length of the DRAM macrocell easily so that low power consumption and high data transfer rate can be achieved easily.

Furthermore, the semiconductor device of the present invention achieves a desired page length only by changing the connection of the metal wiring without changing the circuit configuration or the layout.

These and other advantages of the present invention will become apparent to those skilled in the art upon reading and understanding the following detailed description with reference to the accompanying figures.

BRIEF DESCRIPTION OF THE DRAWINGS

FIGS. 12(1) to 12(4) are tables showing the relationship between the page length and the address allocation.

FIGS. 13(1) to 13(3) are illustrative diagrams of activated areas of memory cell arrays and sense amplifier arrays.

DESCRIPTION OF THE PREFERRED EMBODIMENTS

Figure 1:
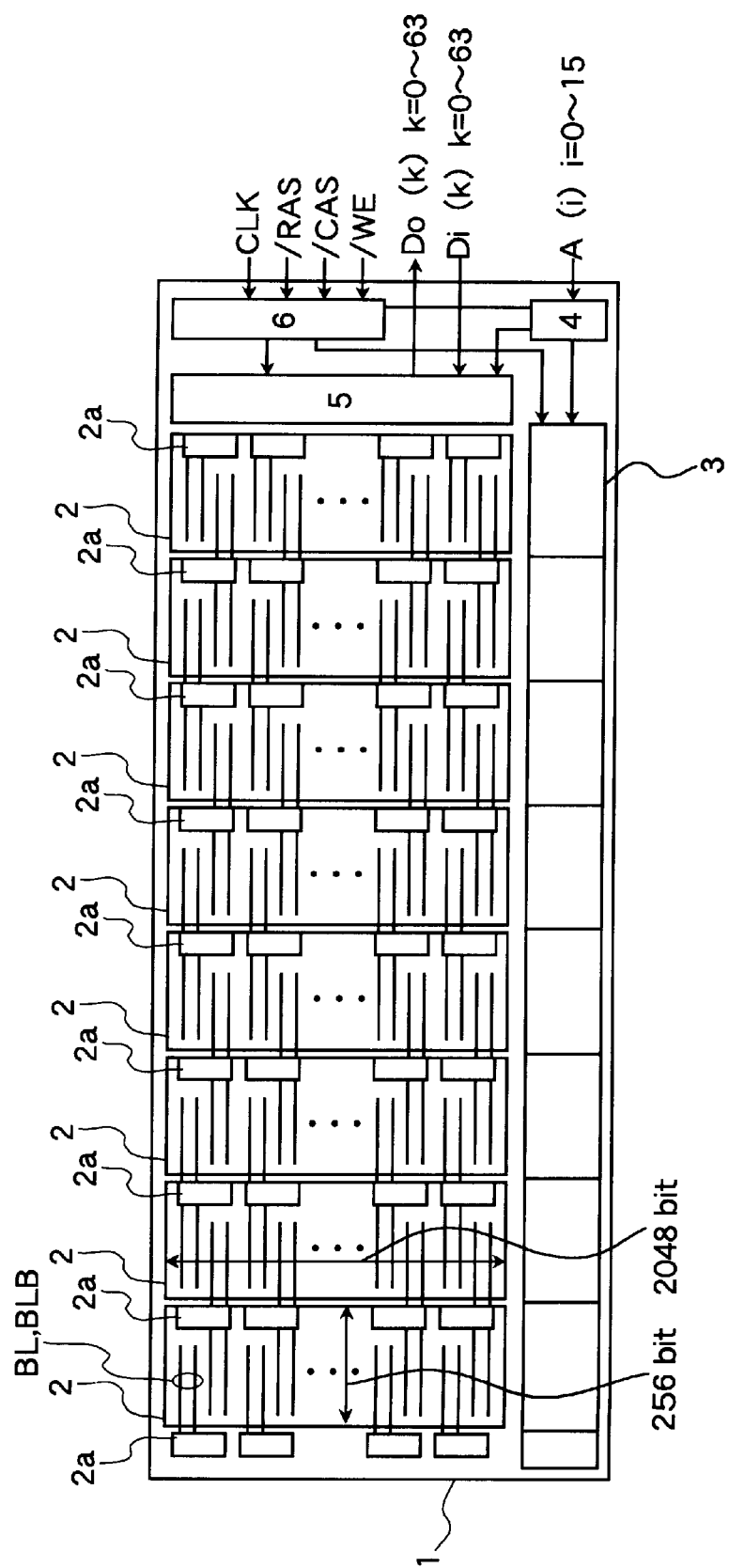
FIG. 1 is a schematic diagram of the layout of a DRAM macrocell to which the present invention is applied.

Hereinafter, a semiconductor device according to an embodiment of the present invention will be described with reference to the accompanying drawings. FIG. 1 is a schematic diagram of the layout of a DRAM macrocell of a semiconductor device according to the present invention.

Referring to FIG. 1, numeral 1 denotes a DRAM macrocell. Numeral 2 denotes a memory block, which is one basic unit composed of memory arrays and sense amplifiers. Numeral 2a denotes a sense amplifying circuit. Numeral 3 denotes a row decoder. Numeral 4 denotes an address predecode circuit. Numeral 5 denotes a main amplifying circuit block. Numeral 6 denotes a control signal generating circuit.

In FIG. 1, the memory block 2 is configured as a 512 K bit array with 256 bits arranged in the row direction and 2048 bits arranged in the column direction. A desired storage capacity can be achieved by arranging the desired number of memory blocks 2. Among principal input/output signals to the DRAM macrocell 1 are clocks (CLK), row address strobe signals (/RAS), column address strobe signals (/CAS), write enable signals (/WE), address input signals (A(i)), data output signals (Do(k)), and data input signals (Di(k)). Herein, "/" is an identifier indicating the negative logic. The DRAM macrocell 1 shown in FIG. 1 has a storage capacity of 4 M (mega) bits, and 64 bits of data can be input and output.

Figure 2:
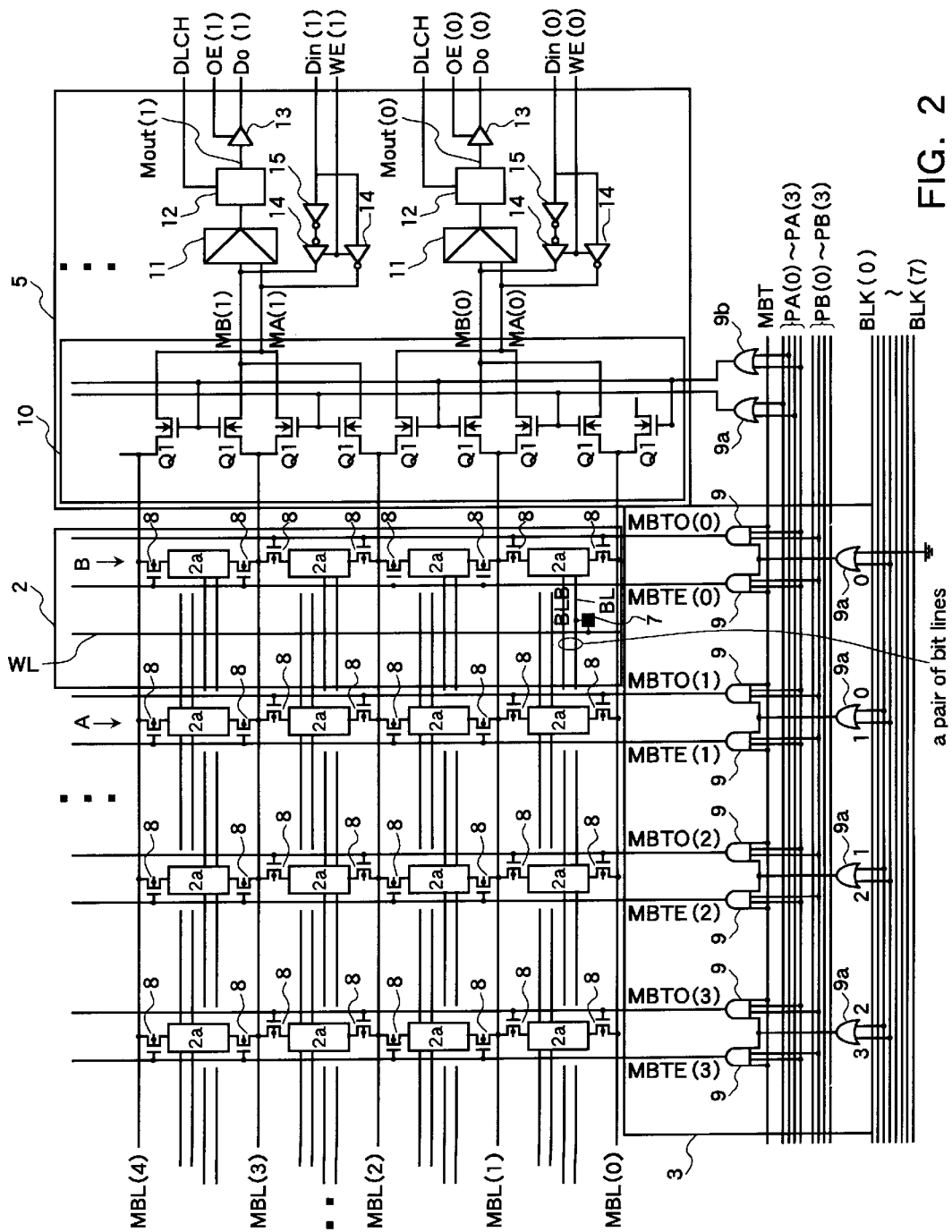
FIG. 2 is a detailed configuration diagram of the DRAM macrocell.

FIG. 2 is a detailed configuration diagram of a part of the DRAM macrocell 1 with the memory block 2, the main amplifying circuit block 5 and the row decoder 3. In FIG. 2, 1024 sense amplifying circuits 2a are arranged in a row. Two sense amplifying circuits 2a share one main bit line, so that 1025 main bit lines MBL are provided including the main bit lines at both ends, and 512 input/output circuits such as main amplifiers 11 are provided.

In the description, "*" indicates any one of these 512 input/output circuits.

In FIG. 2, numeral 7 denotes a memory cell connected to a word line WL and a bit line BL. The sense amplifying circuit 2a is configured by the generally known shared scheme, where one sense amplifier 2a is shared by pairs of bit lines BL and BLB, which are arranged to the right and the left of the sense amplifier 2a.

Numeral 8 denotes a transfer gate formed of an N type MOS transistor. MBL(1), MBL(2), ... denote main bit lines formed of the third metal. The complementary output of the sense amplifier 2a is connected to the selected main bit lines MBL(i), MBL(i+1) via the transfer gate 8 (i=0 to 1023).

Numeral 9 denotes a decoder constituted by an AND circuit having four inputs that selects the opening or closing of the transfer gate 8. An MBT signal for instructing the open/close timing of the transfer gate 8 is connected to a first input thereof. Address decode signals PA(0) to PA(3) and PB(0) to PB(3) for selecting which sense amplifying circuit 2a should be connected to the pair of main bit lines MBL(i), MBL(i+1) are programmably connected to second and third inputs. A result of an OR operation in an OR circuit 9a of the block selecting signals that select adjacent memory blocks 2, which are among the block selecting signals BLK(0) to BLK(7) for selecting the memory block 2 to be activated, is connected to a fourth input.

In the main amplifying circuit block 5, numeral 10 denotes a column decode circuit including N type MOS transistors Q1. A signal resulted from an OR operation of address decode signals PA(0) and PA(2) in the OR circuit 9a and a signal resulted from an OR operation of address decode signals PA(1) and PA(3) in the OR circuit 9b are alternately connected to the gate of the column decode circuit 10.

Numeral 11 denotes a main amplifying circuit that receives MA(*), MB(*) output from the column decoder 10. Numeral 12 denotes a latch circuit that is controlled by a latch signal DLCH. Numeral 13 denotes a tristate buffer whose output is controlled by an output enable signal OE(j). Finally, the read data from the memory cell 7 is output from a data output terminal Do(k) (j=0 to 7, k=0 to 63).

On the other hand, write data is input from a data input terminal Din(k) to MA(*), MB(*), which are coupled to the outputs of the column decoder 10, via the tristate buffer 14. The tristate buffer 14 is controlled by an inverter 15 and a write enable signal WE(j).

Among the input signals to these circuits, the MBT is supplied from the control signal generating circuit 6. The address decode signals PA(0) to PA(3) and PB(0) to PB(3) and the block selecting signal BLK(0) to BLK(7) are supplied from the address predecode circuit.

Figure 3:
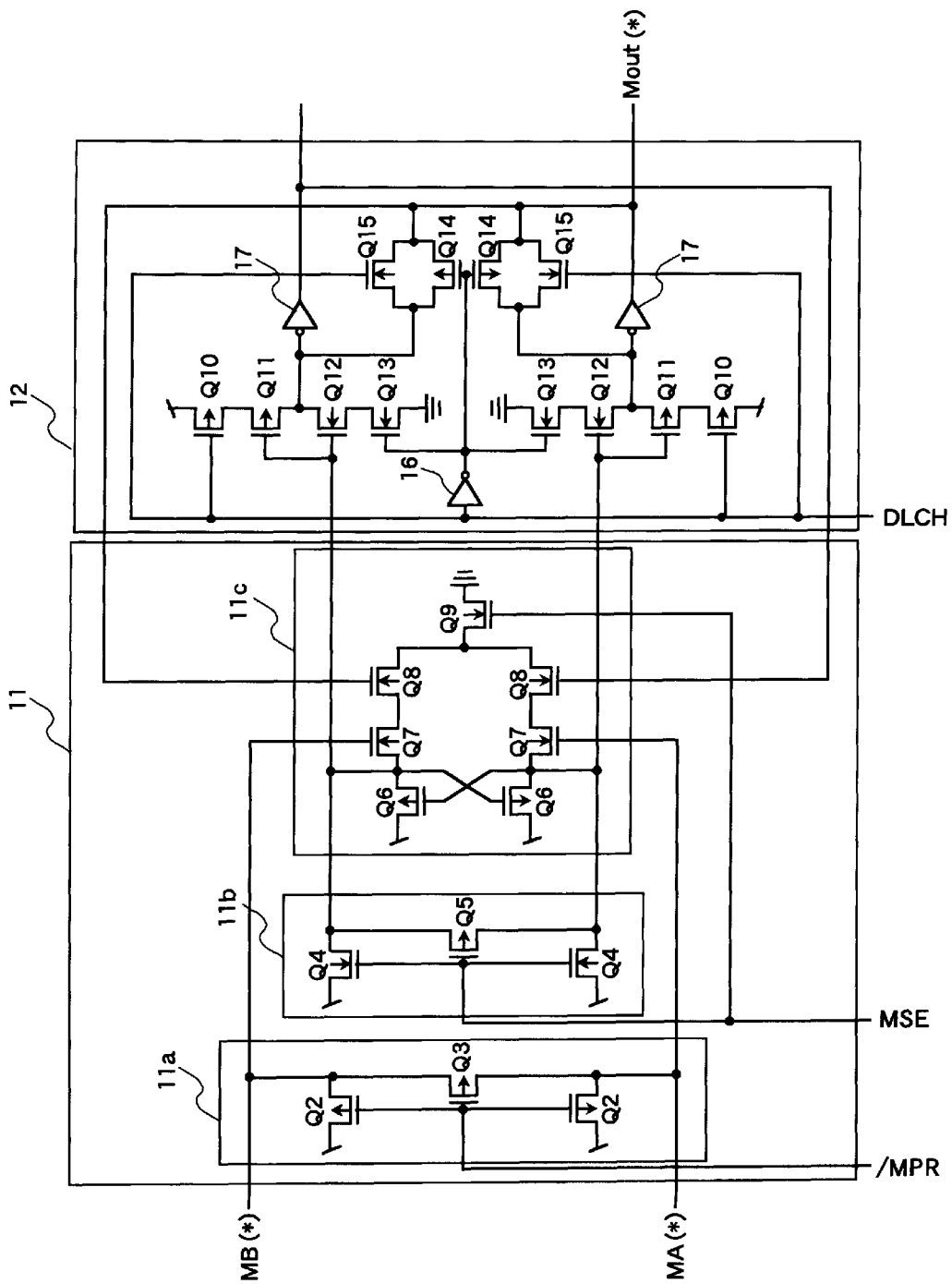
FIG. 3 is a detailed circuit diagram of a main amplifying circuit and a latch circuit.

FIG. 3 is a detailed circuit diagram of the main amplifying circuit 11 and the latch circuit 12. In FIG. 3, a precharge circuit 11a for input signals includes P type MOS transistors Q2 and Q3, and a main bit line precharge signal /MPR is input to the gates of the P type MOS transistors Q2 and Q3. A precharge circuit 11b for output signals includes P type MOS transistors Q4 and Q5, and a main amplifying enable signal MSE is input to the gates of the P type MOS transistors Q4 and Q5. An amplifying circuit 11c includes P type MOS transistors Q6 and N type MOS transistors Q7, Q8 and Q9. The amplifying circuit 11c is a cross couple type amplifier, where the output from each of the P type MOS transistors Q6 is connected to the gate of the other Q6 on the opposite side. To the gate of the N type MOS transistor Q7, the output signals MA(*) and MB(*) from the column decoder 10 are connected. To the gate of the N type MOS transistor Q8, an output from the latch circuit 12 is connected, as described later. To the gate of the N type MOS transistor Q9, the main amplifying enable signal MSE is connected.

The latch circuit 12 includes tristate inverters composed of P type MOS transistors Q10, Q11 and N type MOS transistors Q12, Q13, which are connected in series, inverters 16, 17, and transfer gates composed of P type MOS transistors Q14 and N type MOS transistors Q15. The latch circuit 12 is controlled by a latch signal DLCH, and the complementary outputs therefrom are connected to the N type MOS transistor Q8 of the amplifying circuit 11c. One of the complementary outputs, Mout (*), is connected to the tristate buffer 13 shown in FIG. 2. The input signals /MPR, MSE, and DLCH to these circuits are supplied from the control signal generating circuit 6.

Figure 4:
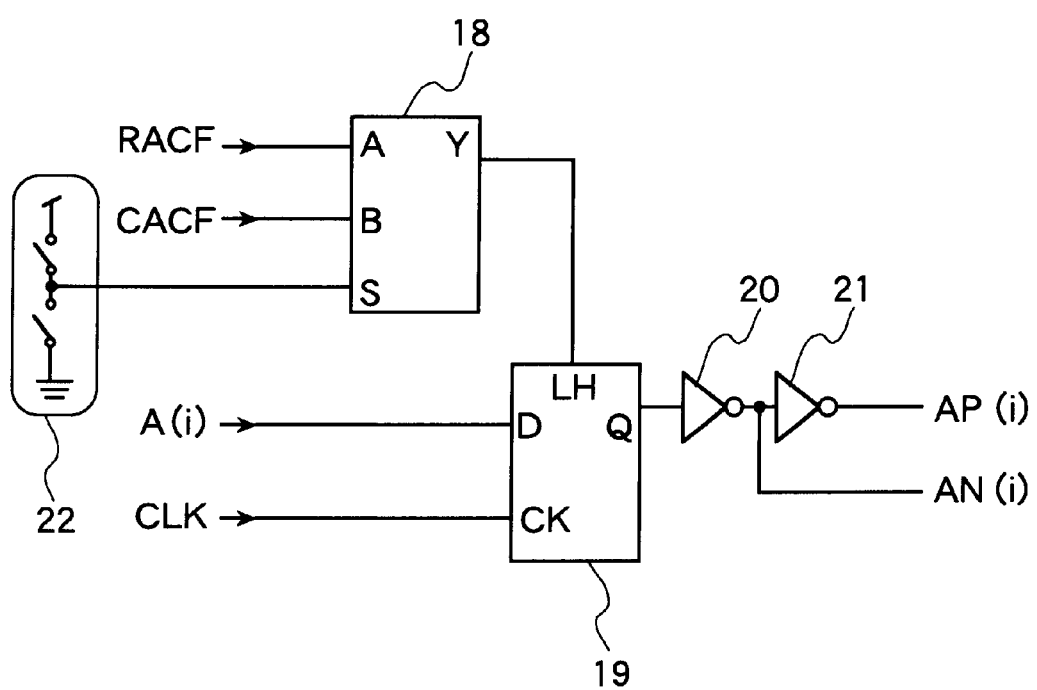
FIG. 4 is a detailed circuit diagram of an input circuit.

FIG. 4 is a detailed circuit diagram of an input circuit of the address predecode circuit 4. In FIG. 4, numeral 18 denotes a selector circuit. Numeral 19 denotes a load/hold type D-FF circuit. Numerals 20 and 21 denote inverters. Numeral 22 denotes a program circuit that is selectively programmed to set the signal level to be high or low.

In the selector circuit 18, a RACF signal for permitting an address input in the RAS cycle is connected to a port A, and a CACF signal for permitting an address input in the CAS cycle is connected to a port B. An output from the program circuit 22 is connected to a selector port S. Either one of the inputs to the port A or the port B is output to an output port Y. In the selector circuit 18, when the input level of the port S is set to the low level, the data of the port A is output to the port Y. When the input level of the port S is set to the high level, the data of the port B is output to the port Y.

In the load/hold type D-FF circuit 19, an output from the selector circuit 18 is connected to a load/hold port LH. An address signal A(i) is connected to a data input port D. A clock signal CLK is connected to a clock port CK. As outputs therefrom, positive and negative logic signals AP(i), AN(i) are output via the inverters 20 and 21.

The program circuit 22 switches the connection either to the power source line or the ground line by means of metal wiring for every address in accordance with the page length specification of a semiconductor device to which the DRAM macrocell 1 is applied. Among the input signals to these circuits, RACF, CACF, and CLK are supplied from the control signal generating circuit 6.

Figure 5:
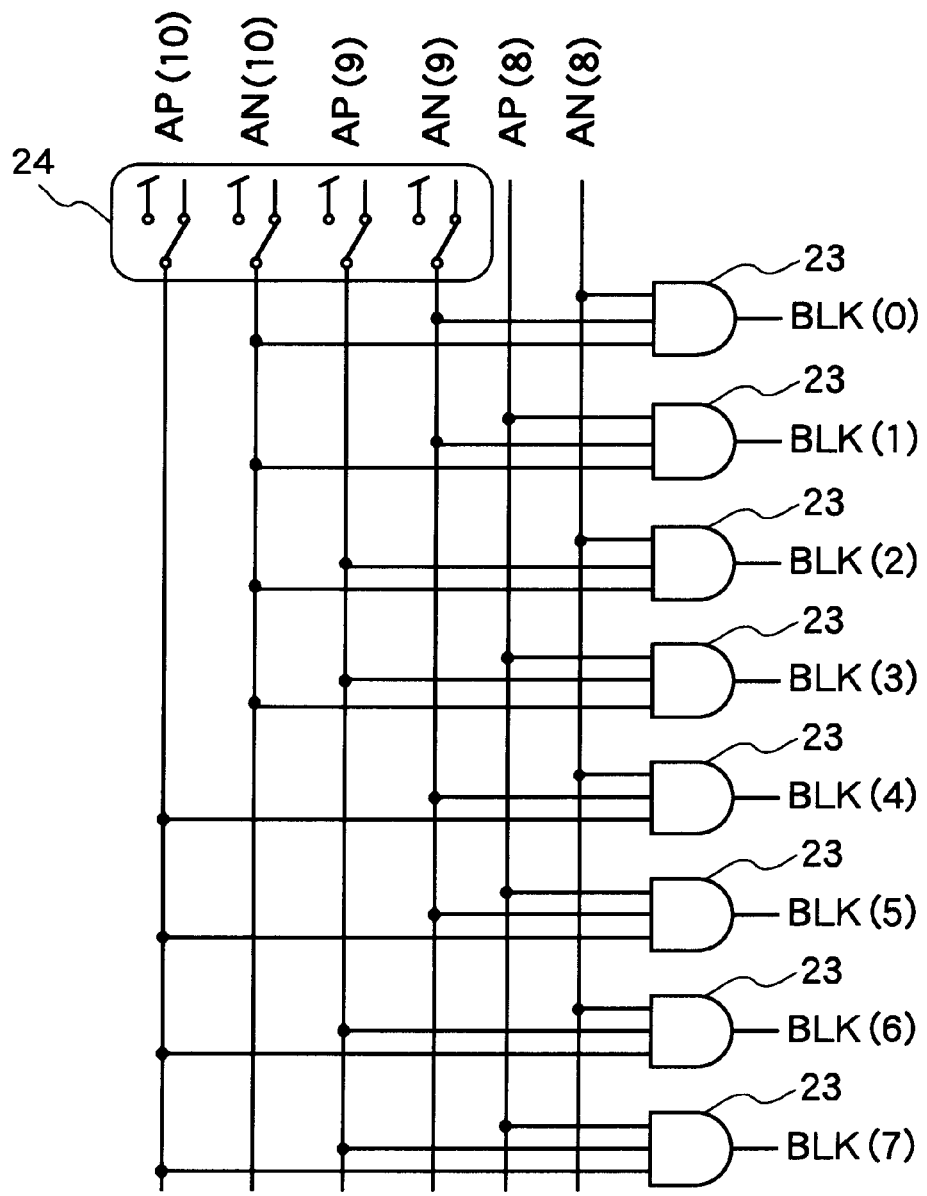
FIG. 5 is a circuit diagram of an address predecode circuit.
Figure 6:
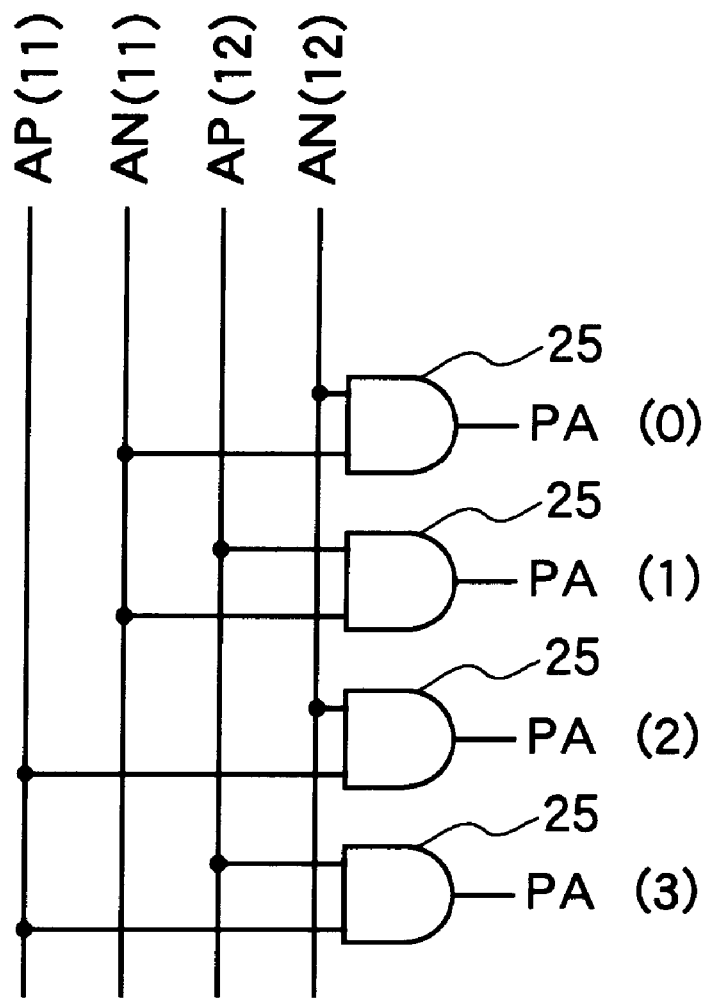
FIG. 6 is a circuit diagram of an address predecode circuit.
Figure 7:
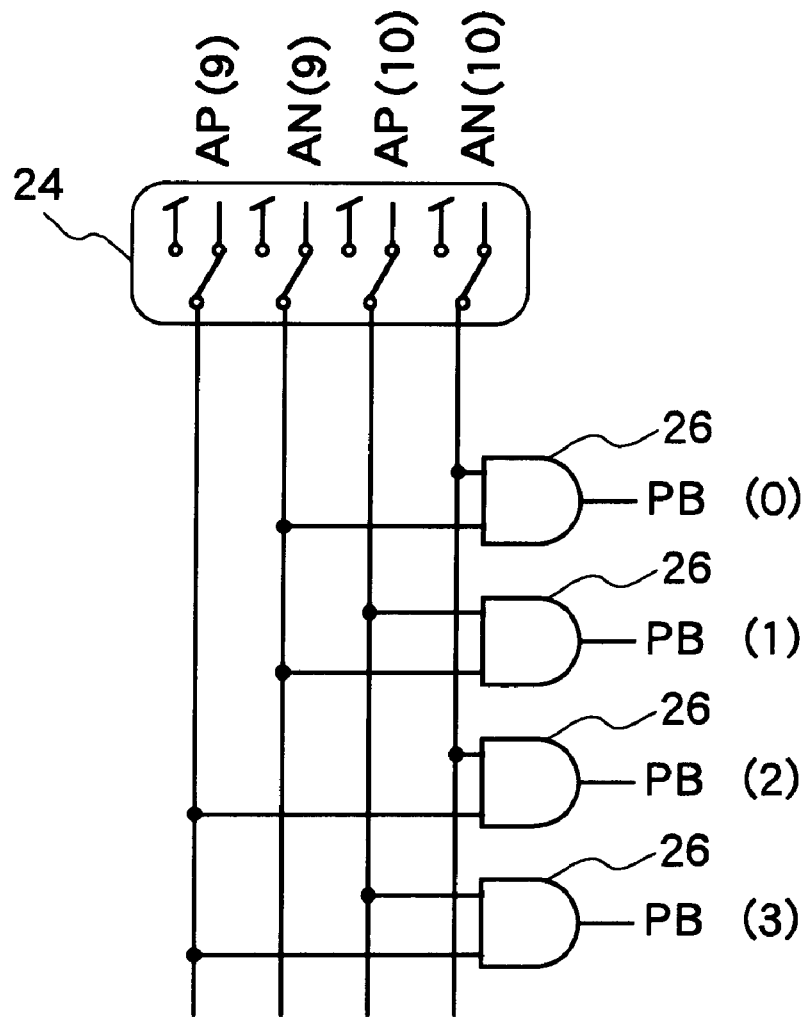
FIG. 7 is a circuit diagram of an address predecode circuit.

FIGS. 5 to 7 are circuit diagrams of address predecode circuits that participate in the selection of main bit lines, which are among the circuits constituting the address predecode circuit 4. FIG. 5 is a circuit diagram of a block selecting predecode circuit for selecting any of eight memory blocks 2. FIGS. 6 and 7 are circuit diagrams of address decode circuits for selecting the main bit line MBL(i) and the sense amplifying circuit 2a. The output signals from all of the circuits are input to the row decoder 3.

Numerals 23, 25 and 26 denote AND circuits. Numeral 24 denotes a program circuit that is selectively programmed to switch the connection either to the power source line or the address signal by metal wiring. The outputs from the input circuit described with reference to FIG. 4 are connected to the address signals.

Figure 8:
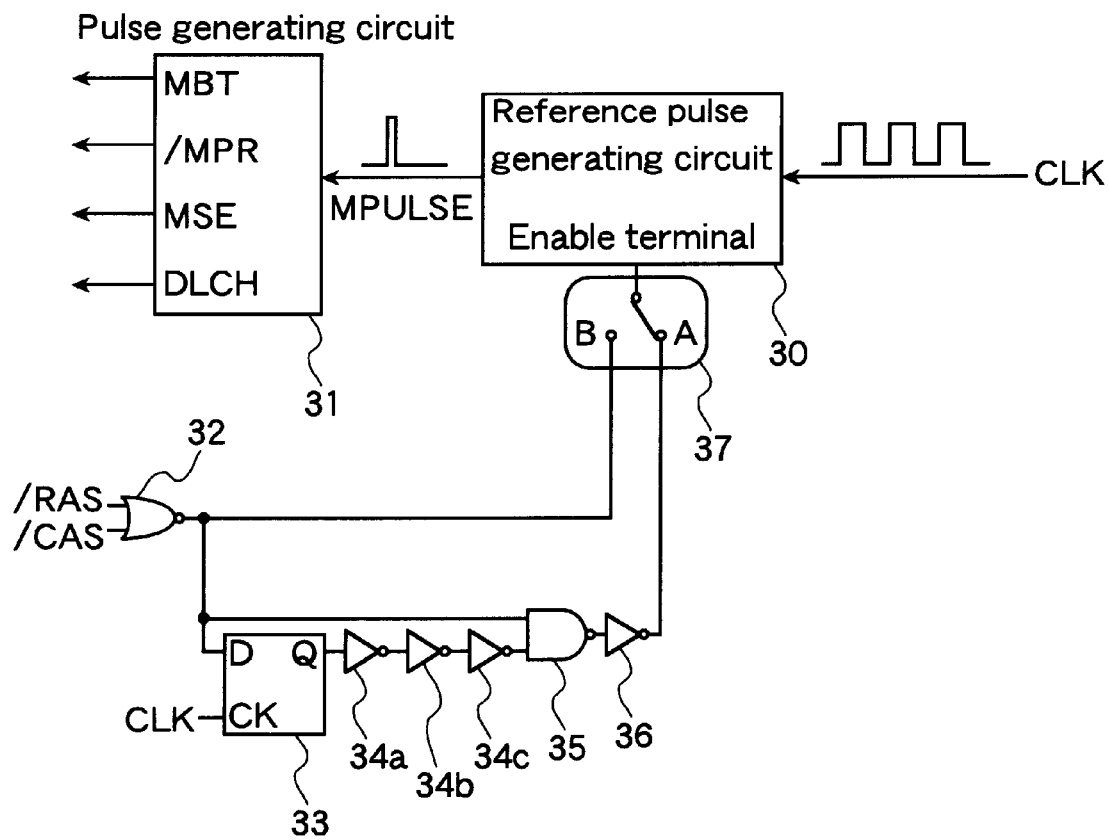
FIG. 8 is a circuit diagram of a control signal generating circuit such as a main amplifier block.

FIG. 8 shows a circuit for generating signals that participate in controlling the main amplifying block 5 and the main bit line shown in FIG. 2 or 3, which are among the circuits constituting the control signal generating circuit 6. Numeral 30 denotes a reference pulse generating circuit for generating an output MPULSE composed of a clock CLK and an enable terminal. Numeral 31 denotes a pulse generating circuit for generating a pulse based on a signal from the reference pulse generating circuit 30. Numeral 32 denotes a NOR circuit to which /RAS and /CAS are input. Numeral 33 denotes a D-FF circuit. Numerals 34a to 34c denote inverters. Numeral 35 denotes an NAND circuit. Numeral 36 denotes an inverter circuit. Numeral 37 denotes a program circuit that is selectively programmed to connect either one of the output B from the NOR circuit 32 or the output A from the inverter 36 to the enable terminal of the reference pulse generating circuit 30 by a metal. The reference pulse generating circuit 30 generates a pulse MPULSE with a predetermined width in synchronization with the rising edge of the clock CLK input during a period when the high level is input to the enable terminal.

Figure 9:
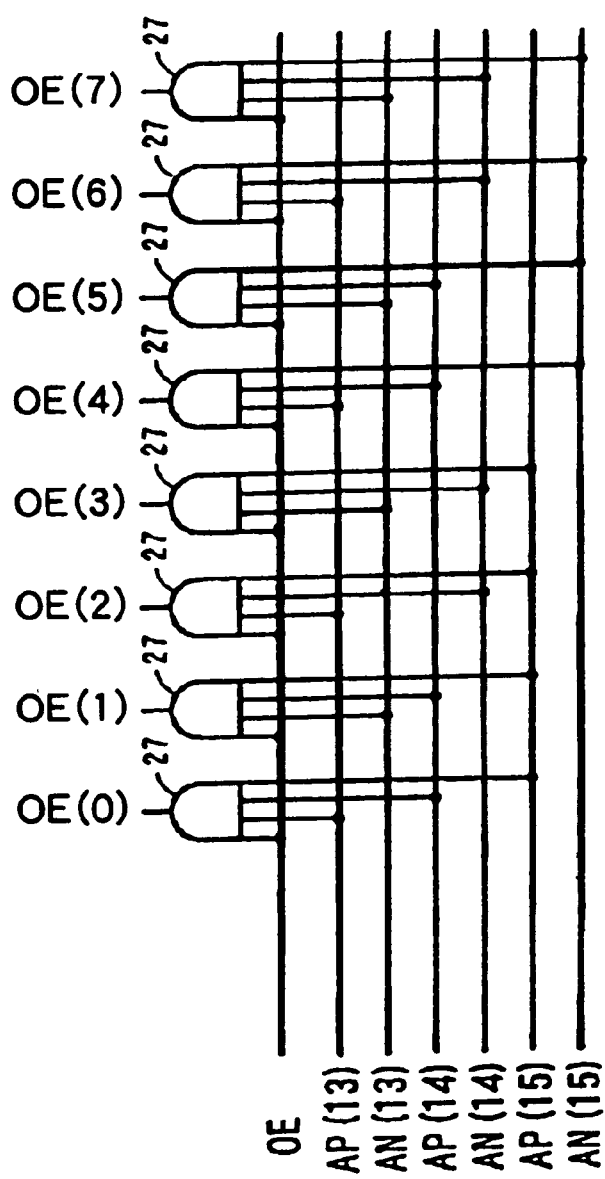
FIG. 9 is a circuit diagram of a predecode circuit of output enable signals.

FIG. 9 is a circuit diagram of a predecode circuit of output enable signals OE(0) to OE(7) for controlling the tristate buffer 13 shown in FIG. 2, which is among the circuits constituting the address predecode circuit 4. Numeral 27 denotes an AND circuit with four inputs, which receives a data output timing control signal OE and address signals for the column AN(13) to AN(15), AP(13) to AP(15) as inputs. The output from the input circuit described with reference to FIG. 4 is connected to the address signals, and the timing control signal OE is supplied from the control signal generating circuit 6.

Figure 10:
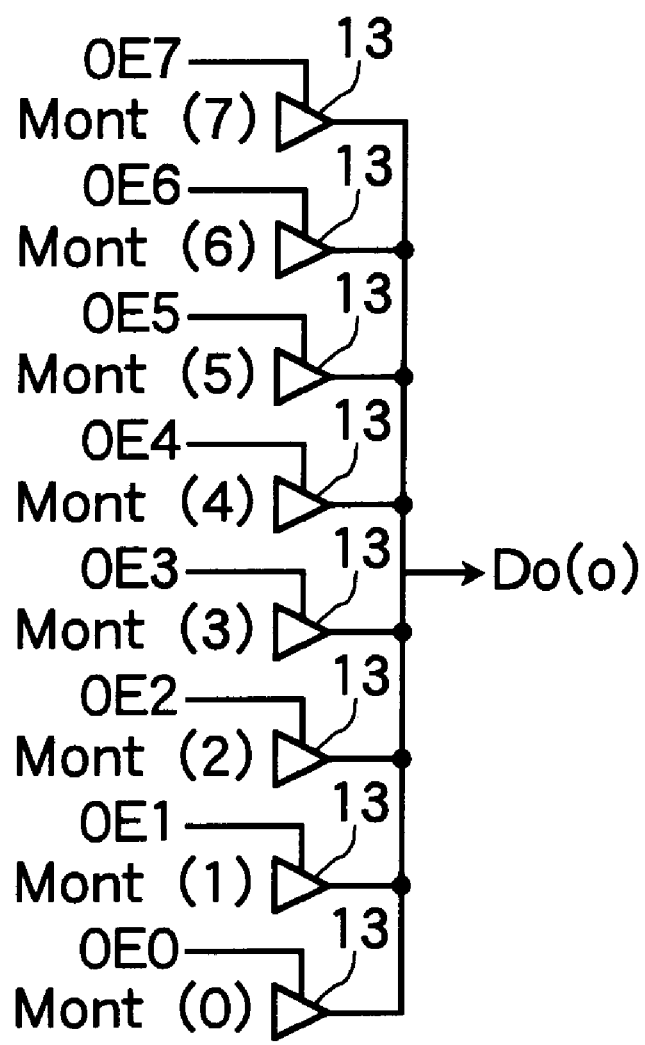
FIG. 10 is a diagram showing a connection in a tristate buffer.

FIG. 10 shows the connections in the tristate buffer 13 shown in FIG. 2. The DRAM macrocell 1 is provided with the tristate buffers 13 for 512 bits that operate in parallel, and the outputs from every eight adjacent tristates buffers are connected by a metal to become common for a 64 bit output configuration. The output enable signal OE(j) described with reference to FIG. 9 is connected to each of the outputs.

Figure 11:
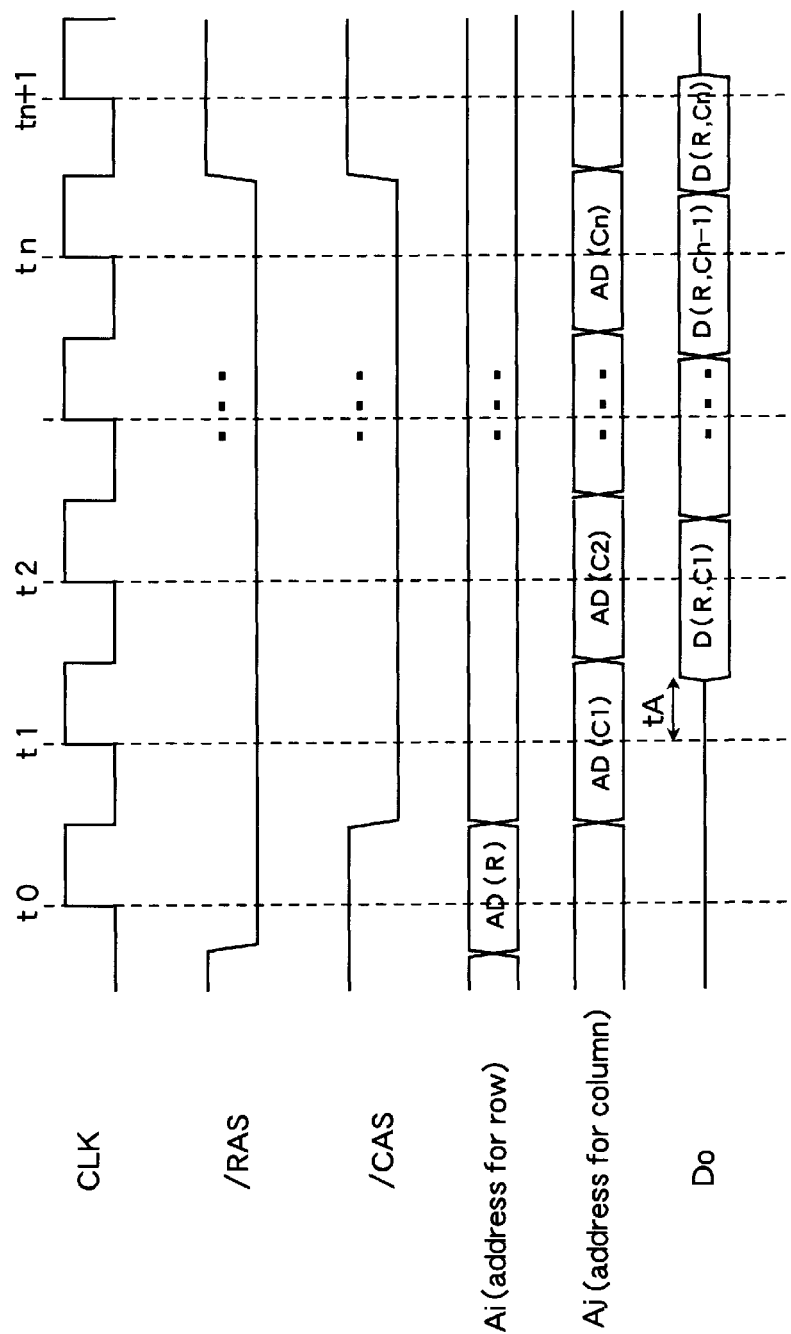
FIG. 11 is a timing diagram with respect to a method for controlling the read of the DRAM macrocell.

Next, the setting method and the operation of the semiconductor device configured as above will be described with reference to the accompanying drawings. FIG. 11 is a timing chart in a method for controlling the read of the DRAM macrocell 1.

In FIG. 11, the operation of the DRAM macrocell 1 is controlled in synchronization with the rising edge of the clock CLK. First, addresses A(i) for the row are acquired in response to the row address strobe /RAS being in the low level and the column address strobe /CAS being in the high level at time t0. Next, addresses A(j) for the column are acquired in response to both of the row address strobe /RAS and the column address strobe /CAS being in the low level at time t1. Thereafter, after tA has passed in the same cycle, the data of a corresponding address is output from a data output terminal Do. Then, when next addresses for the column are input at time t2, similarly, after tA has passed in the same cycle, the data of addresses corresponding thereto is output from the data output terminal Do.

Thereafter, this page mode operation is repeated in the column address space in the prescribed page length. When both of the row address strobe /RAS and the column address strobe /CAS are set to the high level, the precharge operation starts at a timing in synchronization with the high level edge of the clock CLK.

FIG. 12 shows the relationship of the page length and the address allocation. This DRAM macrocell 1 has a storage capacity of 4 M bits and is organized as a ×64 bit configuration, so that the address required is 16 bits from A0 to A15.

As shown in FIG. 12(1), in the case where the maximum page length required by the semiconductor device with a DRAM mounted therein for the DRAM macrocell 1 is 8/page or less, the setting is such that 13 bits from A0 to A12 are acquired in the RAS cycle (at time t0 in FIG. 11), and only 3 bits from A13 to A15 are acquired in the CAS cycle (after time t1 in FIG. 11). More specifically, among the program circuits 22 shown in FIG. 4, circuits for A0 to A12 set the signal level to be low, and circuits for A13 to A15 set the signal level to be high. The program circuit 24 shown in FIG. 5 sets the address signal lines AN(j), AP(j) to be connected, as shown in FIG. 5. The program circuit 24 shown in FIG. 7 sets none of the address signal lines to be connected by switching the connection to the power source lines. The program circuit 37 shown in FIG. 8 sets the enable terminal to be connected to the terminal A in the FIG. 8.

As shown in FIG. 12(2), in the case where the maximum page length required by the semiconductor device with a DRAM mounted therein for the DRAM macrocell 1 is from 9/page to 32/page, the setting is such that 11 bits from A0 to A10 are acquired in the RAS cycle (at time t0 in FIG. 11), and 5 bits from A11 to A15 are acquired in the CAS cycle (after time t1 in FIG. 11). More specifically, among the program circuits 22 shown in FIG. 4, circuits for A0 to A10 set the signal level to be low, and circuits for A11 to A15 set the signal level to be high. The program circuit 24 shown in FIG. 5 sets the address signal lines AN(j), AP(j) to be connected, as shown in FIG. 5. The program circuit 24 shown in FIG. 7 sets none of the signal lines to be connected by switching the connection to the power source lines. The program circuit 37 shown in FIG. 8 sets the enable terminal to be connected to the terminal B in the FIG. 8.

As shown in FIG. 12(3), in the case where the maximum page length required by the semiconductor device with a DRAM mounted therein for the DRAM macrocell 1 is from 33/page to 64/page, the setting is such that 10 bits from A0 to A9 are acquired in the RAS cycle (at time t0 in FIG. 11), and 6 bits from A10 to A15 are acquired in the CAS cycle (after time t1 in FIG. 11). More specifically, among the program circuit 22 shown in FIG. 4, circuits for A0 to A9 are programmed to set the signal level to be low, and circuits for A10 to A15 are programmed to set the signal level to be high. The program circuit 24 shown in FIG. 5 is programmed to set only the address signal lines AN(10) and AP(10) not to be connected by switching the connection to the power source lines. The program circuit 24 shown in FIG. 7 is programmed to set only AN(9) and AP(9) not to be connected by switching the connection to the power source lines. The program circuit 37 shown in FIG. 8 is programmed to set the enable terminal to be connected to the terminal B in the FIG. 8.

As shown in FIG. 12(4), in the case where the maximum page length required by the semiconductor device with a DRAM mounted therein for the DRAM macrocell 1 is from 65/page to 128/page, the setting is such that 9 bits from A0 to A8 are acquired in the RAS cycle (at time t0 in FIG. 11), and 7 bits from A9 to A15 are acquired in the CAS cycle (after time t1 in FIG. 11). More specifically, among the program circuit 22 shown in FIG. 4, circuits for A0 to A8 are programmed to set the signal level to be low, and circuits for A9 to A15 are programmed to set the signal level to be high. The program circuit 24 shown in FIG. 5 is programmed to set none of the address signal lines to be connected by switching the connection to the power source lines. The program circuit 24 shown in FIG. 7 is programmed to set all the address signal lines AN(j), AP(j) to be connected. The program circuit 37 shown in FIG. 8 is programmed to set the enable signal to be connected to the terminal B in the FIG. 8.

As shown in FIG. 1, the DRAM macrocell 1 is composed of eight blocks of memory cell arrays and nine rows of sense amplifiers. FIG. 13 is an illustrative diagram of areas activated by one read or write operation for each page length setting.

In the case where the page length is set to 8/page or 32/page, only one of the output signals BLK(0) to BLK(7) of the block selecting predecode circuit shown in FIG. 5 is selected for an address input. Therefore, as shown in FIG. 13(1), one of the eight blocks of memory arrays and two rows of sense amplifiers on both sides thereof, namely, 2048 sense amplifying circuits 2a are activated.

In the case where the page length is set to 64/page, two of the output signals BLK(0) to BLK(7) of the block selecting predecode circuit shown in FIG. 5 are selected for an address input. Therefore, as shown in FIG. 13(2), two of the eight blocks of memory arrays and four rows of sense amplifiers on both sides thereof, namely, 4096 sense amplifying circuits 2a are activated.

In the case where the page length is set to 128/page, four of the output signals BLK(0) to BLK(7) of the block selecting predecode circuit shown in FIG. 5 are selected for an address input. Therefore, as shown in FIG. 13(3), four of the eight blocks of memory arrays and eight rows of sense amplifiers on both sides thereof, namely, 8192 sense amplifying circuits 2a are activated.

Figure 16:
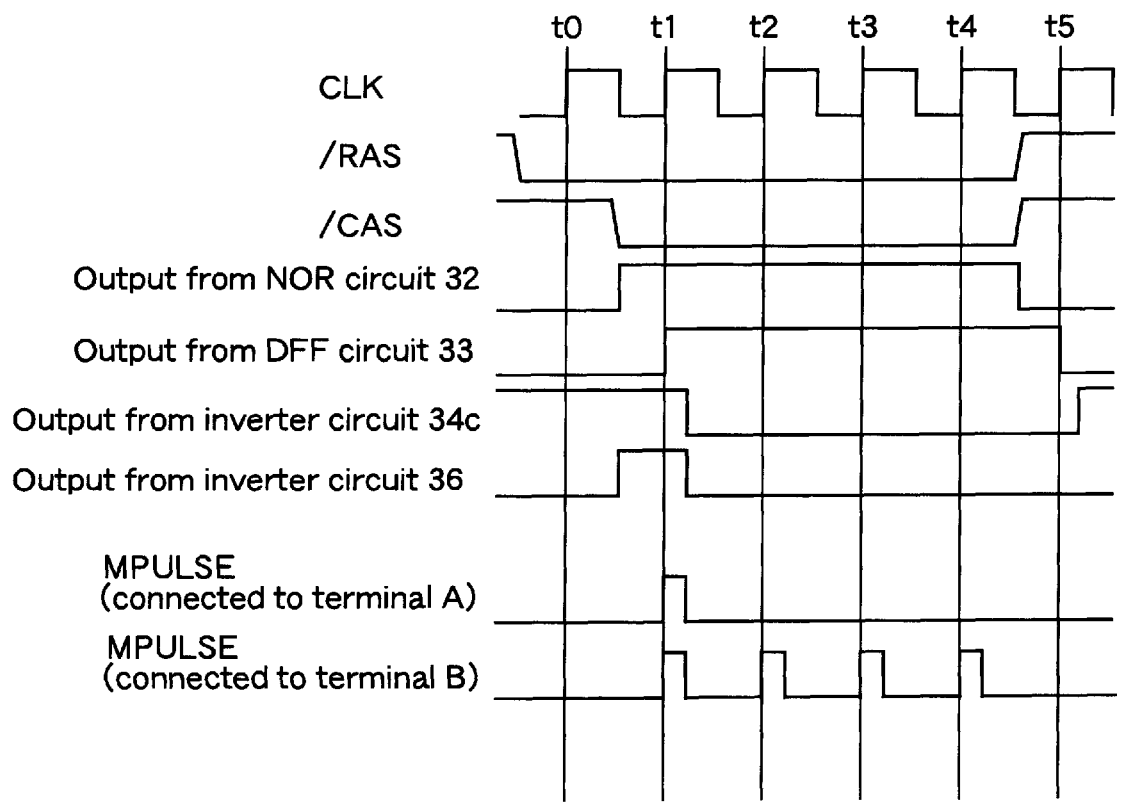
FIG. 16 is a timing chart of a reference pulse generating circuit.

Next, the timing operation of internal signals will be described. FIG. 16 shows the operations of the reference pulse generating circuit 30 shown in FIG. 8 when the enable terminal is connected to the terminal A (namely, the case of the page length of 8/page) and when the enable terminal is connected to the terminal B (namely, the case of the page length of 32/page or more).

In FIG. 16, the NOR circuit 32 outputs signals in the high level during a period when both of /RAS and /CAS are in the low level. Therefore, when the enable terminal is connected to the terminal B, the reference pulse MPULSE is generated in synchronization with the rising edge of the clock CLK every time the clock CLK rises during that period.

On the other hand, the output from the D-FF circuit 33 is a signal obtained by sampling the output from the NOR circuit 32 with the clock CLK, and the signal passes through inverters 34a, 34b, and 34c so as to become an anti-phase signal that is delayed for a predetermined time. The inverter 36 outputs signals in the high level only for a predetermined period after the first rise of the clock after the timing when /RAS and /CAS are both set to the low level. Therefore, when the enable terminal is connected to the terminal A, the reference pulse MPULSE is generated only once in synchronization with the rising edge of the clock CLK.

Figure 14:
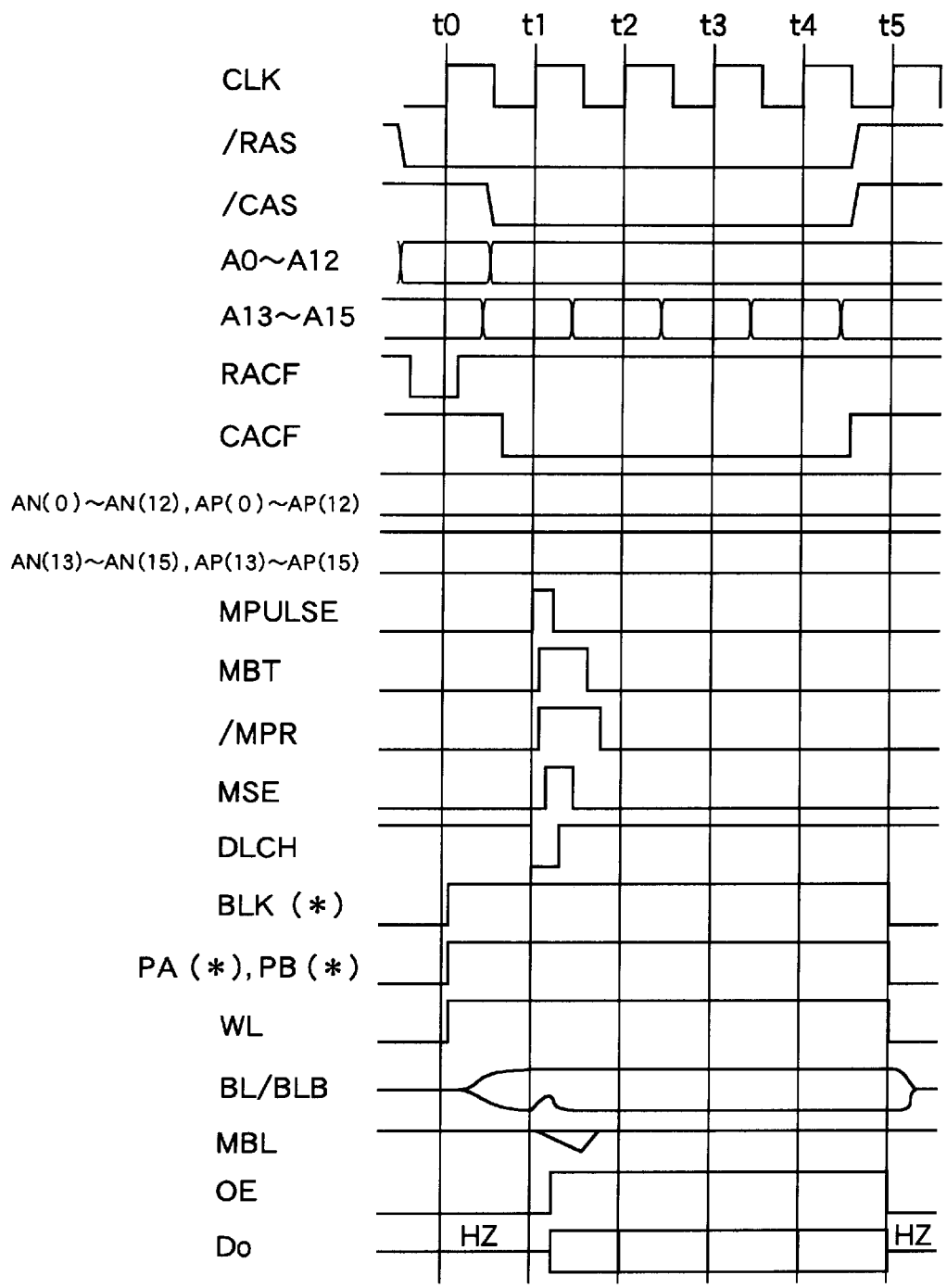
FIG. 14 is a timing chart in the case where the page length is 8/page.

FIG. 14 shows the operation of the DRAM macrocell 1 in the case where the page length is set to 8/page. First, addresses for the row are acquired at time t0. In response to that, the word line WL and the sense amplifier row specified by the block selecting signal BLK(*) are activated so that a pair of bit lines BLB are amplified.

Next, addresses for the column are acquired at time t1, and at the same time, the reference pulse MPULSE is generated by the reference pulse generating circuit 30 only once, as described above. Then, the transfer gate control signal MBT, the latch signal DLCH, the main bit line precharge signal /MPR, and the main amplifying enable signal MSE are generated by the pulse generating circuit 31 in the following timing.

First, the latch signal DLCH is set to the low level so that the signal passes through the latch circuit 12. Thereafter, the main bit line precharge signal /MPR is set to the high level to complete the precharge operation of the main bit lines. At the same time, the transfer gate control signal MBT is set to the high level. Since the address decode signals PA(0) to PA(3) and PB(0) to PB(3) already have been determined by that time, the sense amplifier 2a corresponding to the specified address and the main bit line MBL(i), MBL(i+1) are connected. Thereafter, the main amplifying enable signal MSE is set to the high level, so that the main amplifier 11 is activated to read the data of the sense amplifier 2a. Then, the latch signal DLCH is set to the high level, and the data read by the main amplifier 11 is latched so that the main amplifier is deactivated, and the transfer gate is closed and the main bit line is precharged. Further, the data of a corresponding latch circuit 12 is output from the output terminal Do(k) in response to the instructions of the output enable signal OE(j) and the address for the column.

After t2, the data latched by the latch circuit 12 in a cycle of t1 is output simply by enabling the tristate buffer 13 specified by the column addresses A13 to A15 without performing the operations of the main amplifier 11 or the like. This setting allows low power consumption, because of the activation of the minimum number of the sense amplifier rows and only one amplification operation of the main bit line.

Figure 15:
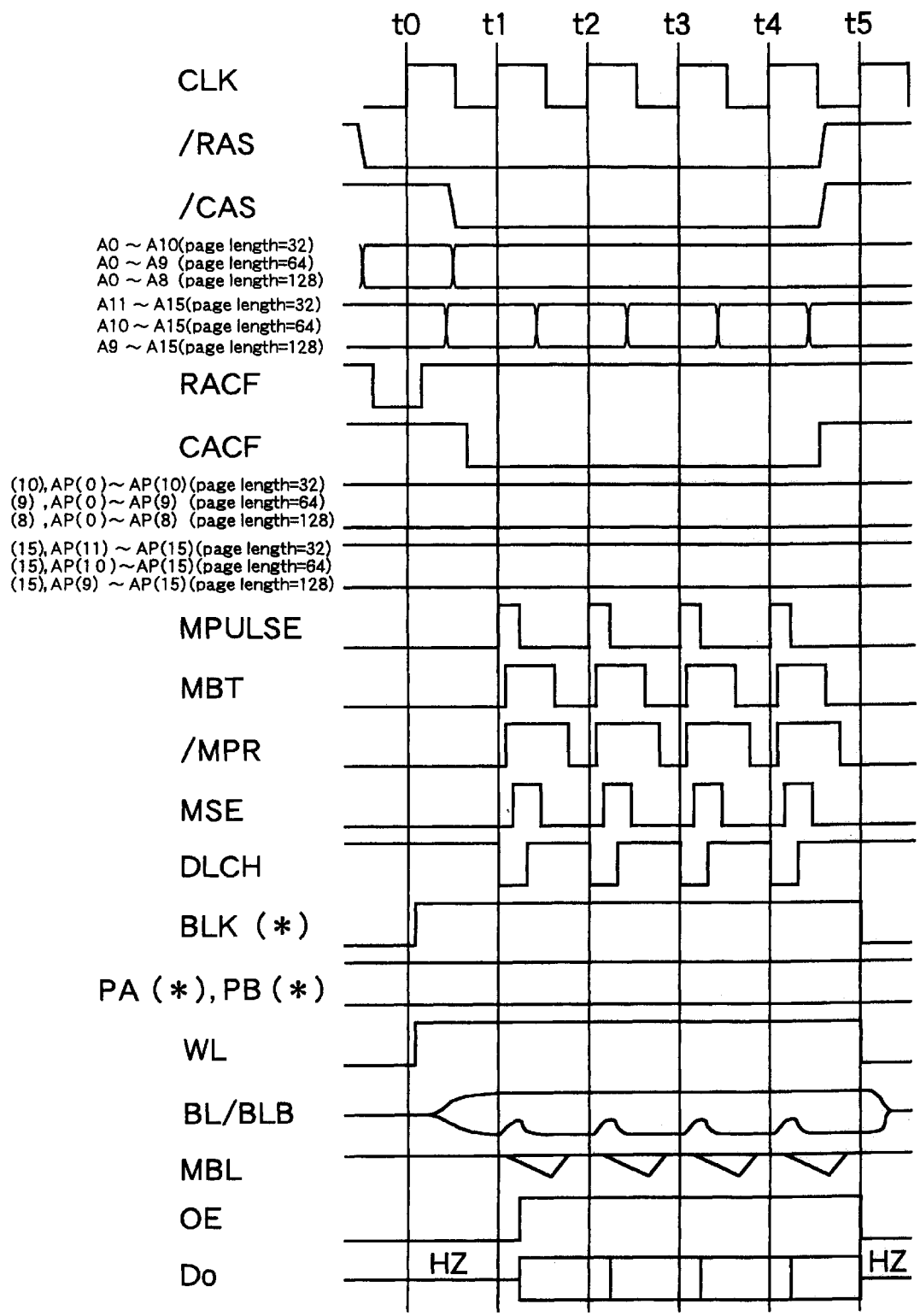
FIG. 15 is a timing chart in the case where the page length is at least 32/page.

FIG. 15 shows the operation of the DRAM macrocell 1 in the case where the page length is set to 32/page or more. This operation differs from that in the case where the page length is set to 8/page in FIG. 14 in the manner of the allocation of the addresses for the row and the columns and in that the read operation of the main amplifier is performed every time in each cycle after t1.

Figure 17:
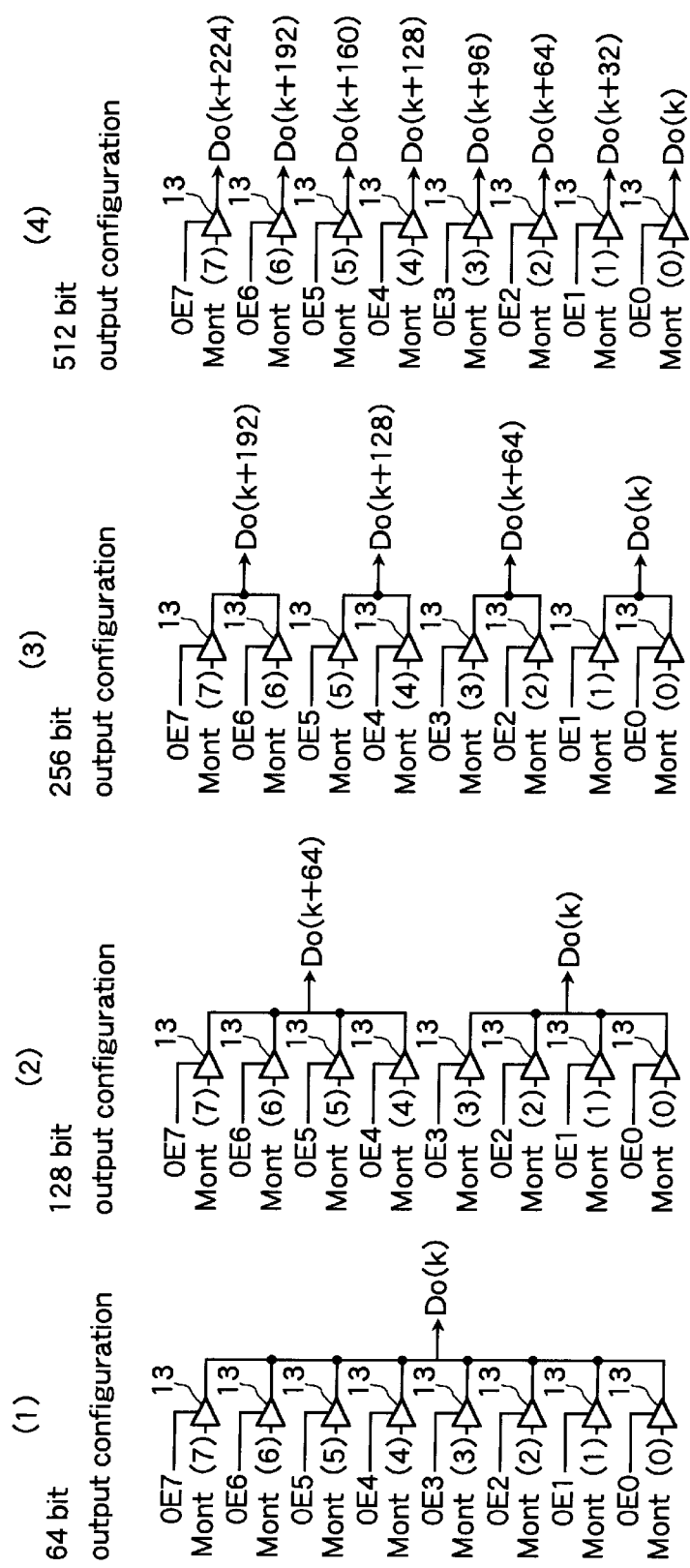
FIGS. 17(1) to 17(4) are diagrams showing connections in the output portion of the tristate buffer.

In the above description, the data width for input and output is fixed to a 64 bit width. Generally, however, the data width required for input and output is varied with the use of the system in which the semiconductor device including the DRAM mounted therein is used. FIG. 17 shows the connections in the output portion when the tristate buffer 13 described with reference to FIG. 2 has varied data widths.

FIG. 17(1) shows the 64 bit output configuration as described with reference with FIG. 10. In this case, the outputs of eight adjacent tristate buffers 13 of 512 tristate buffers 13 are connected by a metal to become common, and this terminal is used as an output terminal Do(k) of the DRAM macrocell 1 (k=0 to 63).

FIG. 17(2) shows a 128 bit output configuration. In this case, the outputs of four adjacent tristate buffers 13 of 512 tristate buffers 13 are connected by a metal to become common, and this terminal is used as an output terminal Do(k) of the DRAM macrocell 1 (k=0 to 127).

FIG. 17(3) shows a 256 bit output configuration. In this case, the outputs of two adjacent tristate buffers 13 of 512 tristate buffers 13 are connected by a metal to become common, and this terminal is used as an output terminals Do(k) of the DRAM macrocell 1 (k=0 to 255).

FIG. 17(4) shows a 512 bit output configuration. In this case, the outputs of 512 tristate buffers 13 are used as the output terminals Do(k) of the DRAM macrocell 1 (k=0 to 511).

Figure 18:
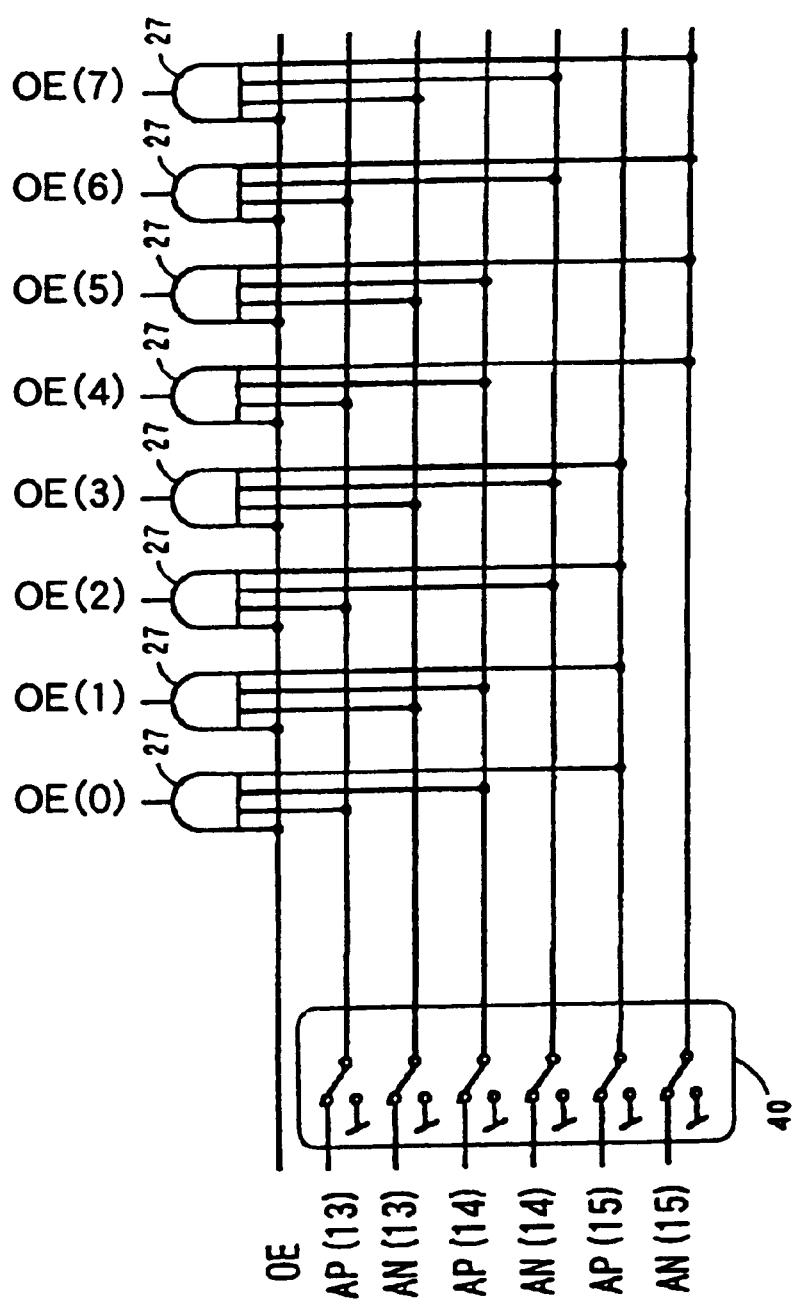
FIG. 18 is a circuit diagram of a predecode circuit of an output enable signal.

FIG. 18 is a circuit diagram of a predecode circuit of the output enable signals OE(0) to OE(7). This predecode circuit has the same configuration as that of FIG. 9 except that a program circuit 40 is added.

In the case of the 64 bit output configuration, as shown in FIG. 18, the circuit is programmed such that the signal lines AN(13) to AN(15) and AP(13) to AP(15) are connected. This program allows only one of the eight outputs OE(0) to OE(7) to be selected.

In the case of the 128 bit output configuration, the circuit is programmed such that AN(15) and AP(15) are not connected by switching the connection to the power source lines. This program allows one of the four outputs OE(0) to OE(3) and one of the four outputs OE(4) to OE(7) to be selected.

In the case of the 256 bit output configuration, the circuit is programmed such that AN(14), AP(14), AN(15) and AP(15) are not connected by switching the connection to the power source lines. This program allows one of the two outputs OE(0) to OE(1), one of the two outputs OE(2) to OE(3), one of the two outputs OE(4) to OE(5), and one of the two outputs OE(6) to OE(7) to be selected.

In the case of a 512 bit output configuration, the circuit is programmed such that none of the address signal lines AN(13) to AN(15) and AP(13) to AP(15) are connected by switching the connection to the source power lines. This program allows all eight outputs to be selected in response to the motion of OE.

In the program circuits 22, 24 and 40, the signals lines are bypassed by metal wiring. However, the present invention is not limited to this method. Any type of switching device may be used. The program circuit may use a programmable contact. Alternatively, a switch using a transistor may be provided instead of the metal wiring.

The selector circuit 18 and the program circuit 22 shown in FIG. 4 are provided for all the bits of address input A0 to A15. However, they may be provided for necessary address bits (A9 to A12 in the case where the page length is 8/page).

Furthermore, in FIG. 8, in the case where the page length is 8/page, the enable terminal is connected to the terminal A, and one reference pulse MPULSE is generated in the CAS cycle. However, in the case where it is necessary to simplify the circuit or the page mode is not used, only signals from the terminal B can be used.

Furthermore, the specification of the DRAM macrocell 1 described with reference to FIG. 11 or other drawings is similar to that of the EDO DRAM, which generally is known. However, synchronous DRAMs or DRAMs including a plurality of banks can be used as well.

As described above, according to the embodiment of the present invention, the activated area and the page length of the DRAM macrocell can be set freely. Therefore, for large capacity data that requires a wide page length, the activated area can be ensured continuously so that the data transfer rate can be high. On the other hand, for regular data that does not require a wide page length, the activated area for processing can be minimized without creating unnecessary activated area so that the power can be saved. Furthermore, since the outputs from a plurality of tristate buffers are connected by a metal, it is possible to change the data width to a desired value only by changing the connection of the metal wiring without changing the configurations of the circuits or the layout.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising:
    memory cells, each of which is a dynamic storage device,
    a memory cell array where the memory cells in a predetermined number are arranged in a matrix, the memory cells being connected to intersections of orthogonal word lines and bit lines;
    first sense amplifying circuits for amplifying electric potentials of the bit lines;
    main bit lines arranged in parallel to the bit lines;
    a memory block array formed such that a plurality of memory blocks including switching circuits share the main bit lines, the switching circuits controlling conductivity between outputs of the first sense amplifying circuits and the main bit lines;
    first selecting means for selecting at least one word line and the associated first sense amplifying circuits belonging to at least one memory block of the plurality of memory blocks;
    second selecting means for selecting a portion of the switching circuits belonging to one memory block of the plurality of memory blocks;
    a control signal generating circuit for controlling the second selecting means,
    wherein the semiconductor device comprises a first program circuit, the first program circuit being selectively programmed to make at least one bit of addresses that specify positions of the memory cells be input at a first timing for row addresses, or be input at a second timing for column addresses.

2. The semiconductor device according to claim 1, wherein the first program circuit is selectively programmed to make at least one bit of address signal for controlling the second selecting means be input at the same timing as that of address signal for controlling the first selecting means, or be input at a timing that is later than the timing of the address signal for controlling the first selecting means.

3. The semiconductor device according to claim 1, further comprising a second program circuit, the second program circuit being selectively programmed such that it disables at least one bit of address signal for controlling the first selecting means while enabling the corresponding address bit for controlling the second selecting means, or such that it enables all the bits of address signal for controlling the first selecting means.

4. The semiconductor device according to claim 1, further comprising second sense amplifying circuits for amplifying data on the main bit lines and latch circuits for latching output data from the second sense amplifying circuits, wherein the control signal generating circuit controls the second selecting means, the second sense amplifying circuits and the latch circuits, wherein the semiconductor device comprises a third program circuit, the third program circuit being selectively programmed such that the control signal generating circuit generates a control signal for the switching circuit every time a column address is specified during a series of column access operations, or such that the control signal generating circuit generates a control signal for the switching circuit only once when a first column address is specified during a series of column access operations.

5. The semiconductor device according to claim 2, wherein the first program circuit comprises programmable connecting means.

6. The semiconductor device according to claim 3, wherein the second program circuit comprises programmable connecting means.

7. The semiconductor device according to claim 4, wherein the third program circuit comprises programmable connecting means.

8. A semiconductor device comprising:

a memory cell array where the memory cells in a predetermined number are arranged in a matrix, the memory cells being connected to intersections of orthogonal word lines and bit lines;

first sense amplifying circuits for amplifying electric potentials of the bit lines;

a memory block array formed such that a plurality of memory blocks including switching circuits share main bit lines, the switching circuits controlling conductivity between outputs of the first sense amplifying circuits and the main bit lines;

second sense amplifying circuits for amplifying data on the main bit lines;

latch circuits for latching output data from the second sense amplifying circuit;

a plurality of tristate buffers that receive outputs from the latch circuits and whose outputs are connected to become common;

first selecting means for selecting at least one word line and the associated first sense amplifying circuits belonging to at least one memory block of the plurality of memory blocks;

second selecting means for selecting a portion of the switching circuits belonging to one memory block of the plurality of memory blocks;

a control signal generating circuit for controlling the second sense amplifying circuit, the latch circuit, and the tristate buffers, wherein only one output of a plurality of outputs, each of which is output from the plurality of tristate buffers whose outputs are connected to become common, is enabled to be output.

* * * * *